(12) United States Patent
Kim et al.

(10) Patent No.: US 8,470,658 B2
(45) Date of Patent: Jun. 25, 2013

(54) SEMICONDUCTOR INTEGRATED CIRCUIT DEVICE AND METHOD OF FABRICATING THE SAME

(75) Inventors: Yong-Don Kim, Hwaseong-si (KR); Hoon Chang, Hwaseong-si (KR); Seo-In Pak, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/070,000

(22) Filed: Mar. 23, 2011

(65) Prior Publication Data

US 2011/0248342 A1      Oct. 13, 2011

(30) Foreign Application Priority Data

Apr. 7, 2010   (KR) ................ 10-2010-0031864

(51) Int. Cl.
*H01L 21/8238*      (2006.01)

(52) U.S. Cl.
USPC ........................................................ 438/209

(58) Field of Classification Search
USPC ........................................................ 438/358
See application file for complete search history.

(56) References Cited

U.S. PATENT DOCUMENTS

| | | | |
|---|---|---|---|
| 5,541,125 A | 7/1996 | Williams et al. | |
| 6,034,402 A * | 3/2000 | Ammo et al. | 257/370 |
| 6,207,484 B1 * | 3/2001 | Kim et al. | 438/209 |
| 6,492,702 B2 * | 12/2002 | Fukushima et al. | 257/458 |
| 7,268,045 B2 | 9/2007 | Hower et al. | |
| 2002/0017683 A1 * | 2/2002 | Jeon | 257/339 |
| 2003/0205735 A1 * | 11/2003 | Fujisawa et al. | 257/200 |
| 2009/0166797 A1 * | 7/2009 | Kim et al. | 257/500 |
| 2010/0073541 A1 * | 3/2010 | Kawahito | 348/311 |

OTHER PUBLICATIONS

Letavic, et al.; 20V Asymmetric Complementary Power Device Implementation with a 0.25um CMOS Technology for Power Management Application; Proceedings of the 17th International Symposium on Power Semiconductor Devices & IC's; May 23-26, 2005; pp. 1-3 and 162; 0-7803-8889-5/05; IEEE; Santa Barbara, California, United States.

Zhu, et al.; Stepped-Drift LDMOSFET: A Novel Drift Region Engineered Device for Advanced Smart Power Technologies; Proceedings of the 18th International Symposium on Power Semiconductor Devices & IC's; Jun. 4-8, 2006;1-4244-9715-0/06; IEEE; Naples, Italy.

* cited by examiner

*Primary Examiner* — Charles Garber
*Assistant Examiner* — Andre C Stevenson
(74) *Attorney, Agent, or Firm* — Lee & Morse, P.C.

(57) ABSTRACT

A semiconductor integrated circuit device and method of fabricating a semiconductor integrated circuit device, the method including preparing a first conductivity type substrate including a first conductivity type impurity such that the first conductivity type substrate has a first impurity concentration; forming a buried impurity layer using blank implant such that the buried impurity layer includes a first conductivity type impurity and has a second impurity concentration higher than the first impurity concentration; forming an epitaxial layer on the substrate having the buried impurity layer thereon; and forming semiconductor devices and a device isolation region in or on the epitaxial layer.

18 Claims, 10 Drawing Sheets

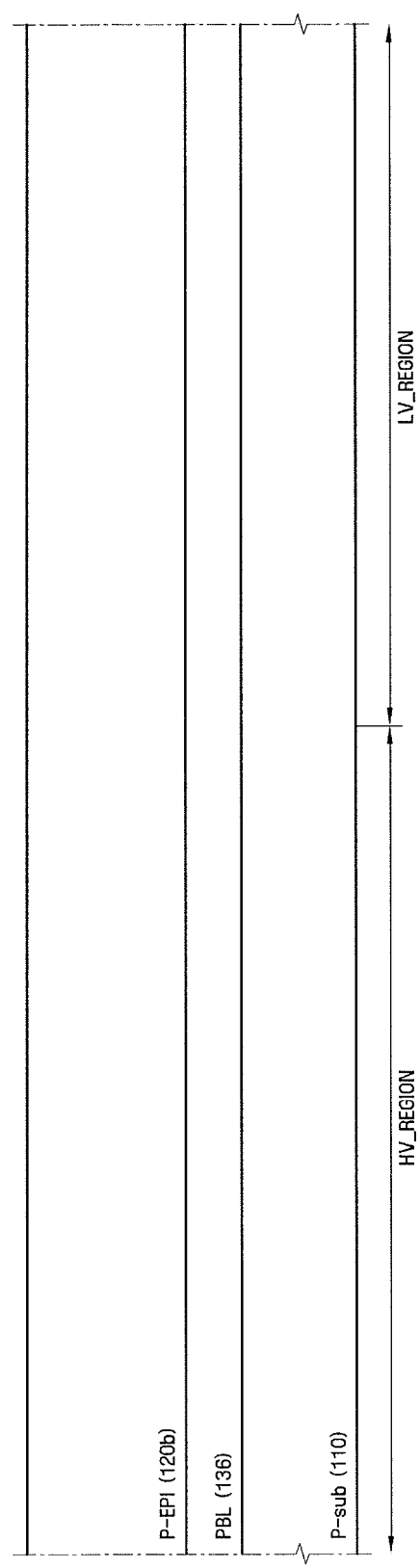

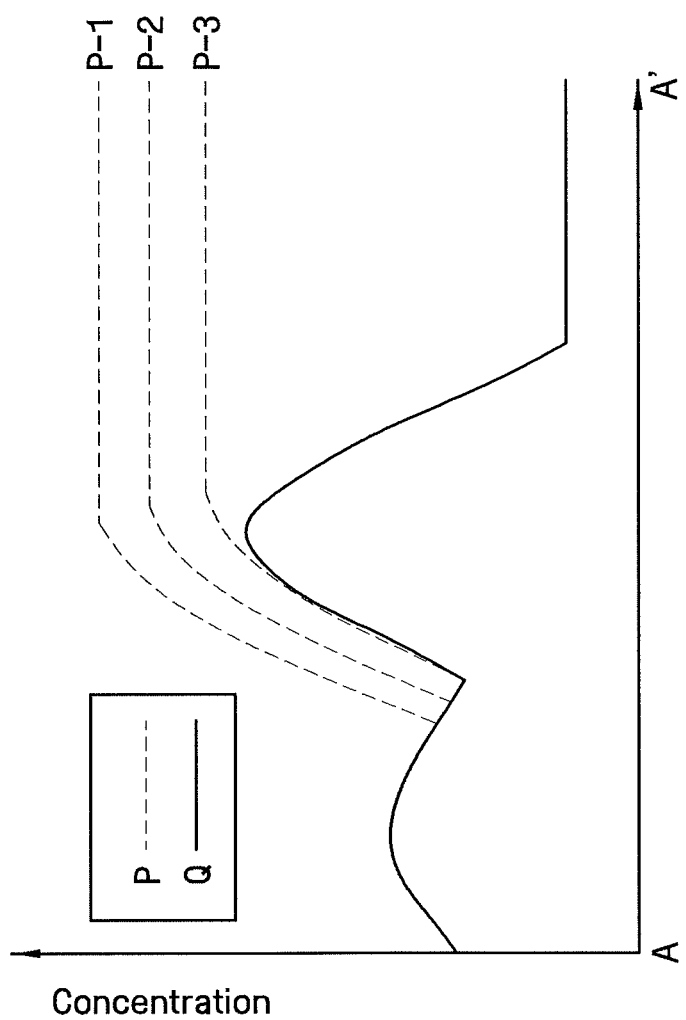

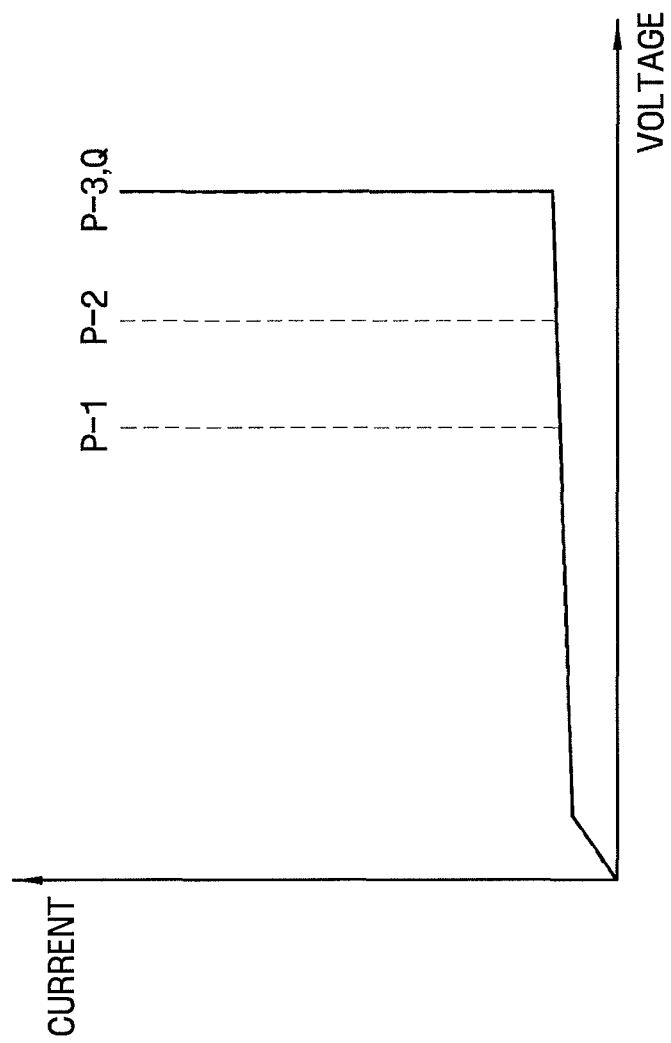

SEMICONDUCTOR INTEGRATED CIRCUIT DEVICE AND METHOD OF FABRICATING THE SAME

BACKGROUND

1. Field

Embodiments relate to a semiconductor integrated circuit device and a method of fabricating the same.

2. Description of the Related Art

Semiconductor integrated circuit devices, e.g., a system-on-chip (SOC), a microcontroller unit (MCU), and a display driver IC (DDI), may include a plurality of peripheral devices, e.g., a processor, a memory, a logic circuit, an audio and image processing circuit, and various interface circuits. Thus, the semiconductor integrated circuit devices may include transistors having various driving voltages. For example, a high voltage driving transistor, an intermediate voltage driving transistor, and a low voltage driving transistor may be included in a semiconductor integrated circuit device.

SUMMARY

Embodiments are directed to a semiconductor integrated circuit device and a method of fabricating the same.

The embodiments may be realized by providing a method of fabricating a semiconductor integrated circuit device, the method including preparing a first conductivity type substrate including a first conductivity type impurity such that the first conductivity type substrate has a first impurity concentration; forming a buried impurity layer using blank implant such that the buried impurity layer includes a first conductivity type impurity and has a second impurity concentration higher than the first impurity concentration; forming an epitaxial layer on the substrate having the buried impurity layer thereon; and forming semiconductor devices and a device isolation region in or on the epitaxial layer.

The epitaxial layer may include a first conductivity type epitaxial layer having a third impurity concentration, and the first conductivity type may be a P-type.

The second impurity concentration may be higher than the third impurity concentration.

The first conductivity type impurity may include boron.

The epitaxial layer may include a second conductivity type epitaxial layer, the first conductivity type may be a P-type, and the second conductivity type may be an N-type.

The method may further include performing a drive-in diffusion process on the buried impurity layer.

The semiconductor device may include a high-voltage semiconductor device driven at about 30 to about 50 V and a low-voltage semiconductor device driven at about 1 to about 5 V, and the device isolation region may be formed between the high-voltage semiconductor device and the low-voltage semiconductor device.

The buried impurity layer may be formed on the substrate.

The embodiments may also be realized by providing a method of fabricating a semiconductor integrated circuit device, the method including preparing a first conductivity type substrate such that the first conductivity type substrate includes a high-voltage device region and a low-voltage device region; implanting a first conductivity type impurity into an entire surface of the substrate at a first dose; diffusing the first conductivity type impurity; forming an epitaxial layer on the first conductivity type impurity diffused substrate; and forming a high-voltage semiconductor device and a low-voltage semiconductor device in the high-voltage device region and the low-voltage device region, respectively.

The first dose may be about $10^{14}$ atoms/cm$^2$ to about $10^{16}$ atoms/cm$^2$.

The high-voltage semiconductor device may include a high-voltage transistor driven at about 30 to about 50 V, and the low-voltage semiconductor device may include a low-voltage transistor driven at about 1 to about 5 V.

The transistors may include lateral double-diffused metal oxide semiconductor (DMOS) transistors.

The epitaxial layer may include a first conductivity type epitaxial layer, and the first conductivity type may be a P-type.

The first conductivity type impurity may include boron.

The epitaxial layer may include a second conductivity type epitaxial layer, the first conductivity type may be a P-type, and the second conductivity type may be an N-type.

The embodiments may also be realized by providing a semiconductor integrated circuit device including a first conductivity type substrate having a first impurity concentration, the substrate having a high-voltage device region and a low-voltage device region defined therein; a buried impurity layer on an entire surface of the substrate, the buried impurity layer including a first conductivity type impurity and having a second impurity concentration higher than the first impurity concentration, and being formed using blank implant; an epitaxial layer on the buried impurity layer; and high-voltage semiconductor devices and low-voltage semiconductor devices respectively formed in the high-voltage device region and the low-voltage device region formed in or on the epitaxial layer.

The epitaxial layer may include a first conductivity type epitaxial layer having a third impurity concentration, the first conductivity type may be a P-type, and the first conductivity type impurity may include boron.

The second impurity concentration may be higher than the third impurity concentration.

The epitaxial layer may include a second conductivity type epitaxial layer, the first conductivity type may be a P-type, and the second conductivity type may be an N-type.

The high-voltage semiconductor device may include a high-voltage lateral double-diffused metal oxide semiconductor (DMOS) transistor driven at about 30 to about 50 V, and the low-voltage semiconductor device may include a low-voltage lateral double-diffused metal oxide semiconductor (DMOS) transistor driven at about 1 to about 5 V.

BRIEF DESCRIPTION OF THE DRAWINGS

The embodiments more apparent to those of ordinary skill in the art by describing in detail exemplary embodiments with reference to the attached drawings, in which:

FIG. 8 illustrates a cross-sectional view of a stage in the method of fabricating a semiconductor integrated circuit device of FIG. 7; and FIGS. 9 and 10 illustrate graphs showing characteristics of a semiconductor integrated circuit device according to an embodiment.

DETAILED DESCRIPTION

Figure 1:
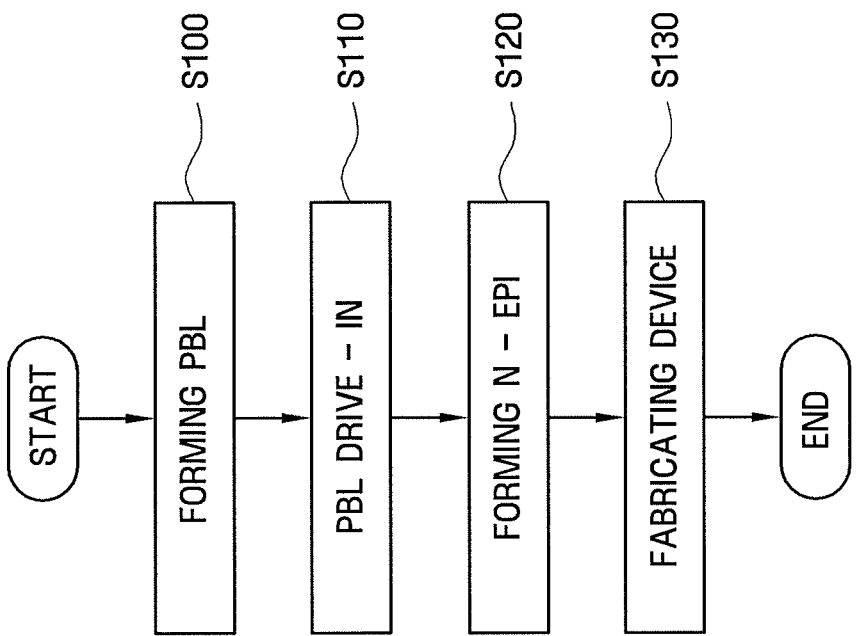
FIG. 1 illustrates a flowchart of a method of fabricating a semiconductor integrated circuit device according to an embodiment.

Korean Patent Application No. 10-2010-0031864, filed on Apr. 7, 2010, in the Korean Intellectual Property Office, and entitled: "Semiconductor Integrated Circuit Device and Fabricating Method of the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of fabricating a semiconductor integrated circuit device according to an embodiment will be described with reference to FIGS. 1 through 6.

FIG. 1 illustrates a flowchart of a method of fabricating a semiconductor integrated circuit device according to an embodiment. FIGS. 2 through 6 illustrate cross-sectional views of stages in the method of fabricating a semiconductor integrated circuit device of FIG. 1.

While FIG. 1 illustrates a particular device by way of example to describe the semiconductor integrated circuit device according to an embodiment, the embodiments are not limited thereto; and the embodiments may also be applied to a semiconductor integrated circuit device, e.g., a system-on-chip (SOC) or a microcontroller unit (MCU).

Referring first to FIG. 1, a first conductivity type substrate having a first impurity concentration may be prepared. Then, a buried impurity layer including a first conductivity type impurity, as indicated by reference symbol "PBL" in FIG. 1, having a second impurity concentration higher than the first impurity concentration may be formed using blank implant (S100).

Figure 2:
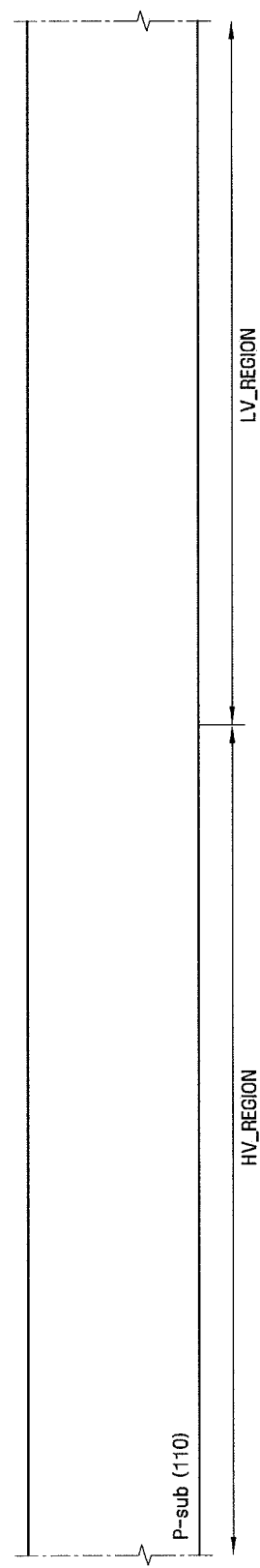
FIGS. 2 through 6 illustrate cross-sectional views of stages in the method of fabricating a semiconductor integrated circuit device of FIG. 1.

For example, referring to FIG. 2, a high-voltage device region HV_REGION and a low-voltage device region LV_REGION may be defined in the substrate 110. In an implementation, the high-voltage device region HV_REGION may include, e.g., a high-voltage digital circuit; and the low-voltage device region LV_REGION may include, e.g., a low-voltage digital circuit and/or an analog circuit. For example, the high-voltage device region HV_REGION may be a potential high-voltage transistor region driven at about 30 to about 50 V (see HP or HN shown in FIG. 6), while the low-voltage device region LV_REGION may be a potential low-voltage transistor region driven at about 1 to about 5 V (see LP or LN shown in FIG. 6). In an implementation, the high-voltage device region HV_REGION and the low-voltage device region LV_REGION may be lateral double-diffused metal oxide semiconductor (DMOS) transistors, but the embodiments are not limited thereto.

Although not shown in FIG. 2, in an implementation, the substrate 110 may have an intermediate-voltage device region (not shown) further defined therein. For example, the high-voltage device region HV_REGION may be a potential high-voltage transistor region driven at about 30 to about 50 V (see HP or HN shown in FIG. 6), the intermediate-voltage device region (not shown) may be a potential intermediate-voltage transistor region driven at about 5 to about 10 V, and the low-voltage device region LV_REGION may be a potential high-voltage transistor region driven at about 1 to about 5 V (see LP or LN shown in FIG. 6). For example, the high-voltage device region HV_REGION, the intermediate-voltage device region and the low-voltage device region LV_REGION may be lateral double-diffused metal oxide semiconductor (DMOS) transistors, but the embodiments are not limited thereto.

The substrate 110 may be, e.g., a silicon substrate, a gallium arsenic substrate, a silicon germanium substrate, a ceramic substrate, a quartz substrate, a glass substrate for a display device, or a SOI (Silicon on Insulator) substrate.

Figure 3:
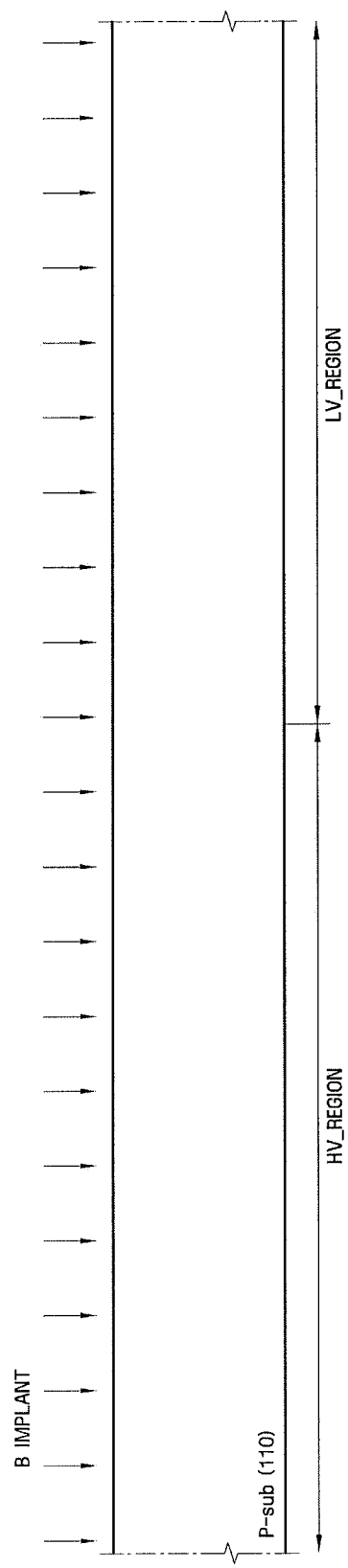

Referring to FIG. 3, a first conductivity type impurity, e.g., P-type impurity, may be implanted at a first dose into an entire surface of the high-voltage device region HV_REGION and the low-voltage device region LV_REGION of the substrate 110. The first conductivity type impurity (e.g., P-type, impurity) may be implanted into the substrate 110 without a separate mask, as shown in FIG. 3. The first conductivity type (e.g., P-type impurity) may include, e.g., boron (B); and the first dose may be, e.g., about $10^{14}$ atoms/cm$^2$ to about $10^{16}$ atoms/cm$^2$.

Figure 4:
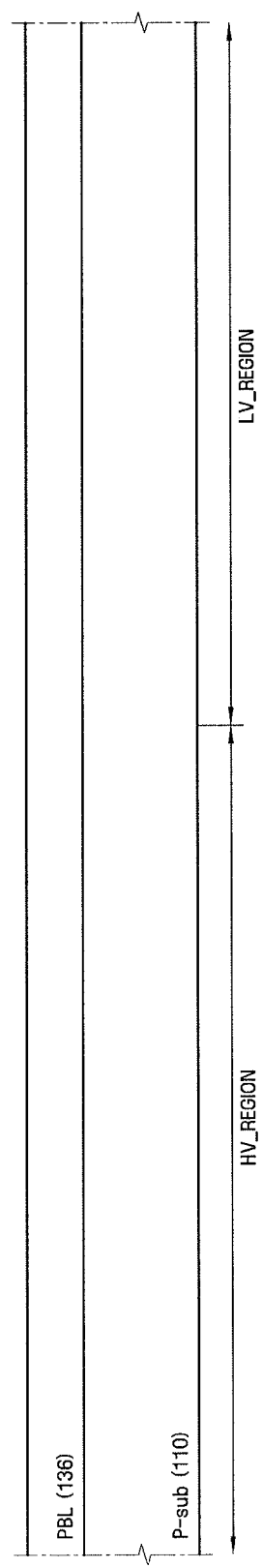

Referring to FIG. 4, a buried impurity layer 136 including the first conductivity type impurity (e.g., P-type impurity such as boron) and having a second impurity concentration higher than the first impurity concentration, may be formed on the substrate 110 by the implantation, e.g., a blank implant. Here, the blank implant may refer to implantation of impurity on the entire surface of the substrate 110 without using a separate mask.

Referring to FIGS. 1 and 4, the buried impurity layer 136 formed on the substrate 110 may be subjected to a "drive-in" diffusion process (S110). For example, the first conductivity type impurity (e.g., P-type, impurity such as boron (B)) included in the buried impurity layer 136 may be diffused by thermal treatment. The occurrence of defects, e.g., a crack of a potential epitaxial layer (120a of FIG. 5), may be prevented through the above-described process. In addition, it is possible to prevent the first conductivity type impurity (e.g., P-type, impurity such as boron (B)) included in the buried impurity layer 136 from freely moving toward the epitaxial layer (120a of FIG. 5), which may be referred to as autodoping.

Figure 5:
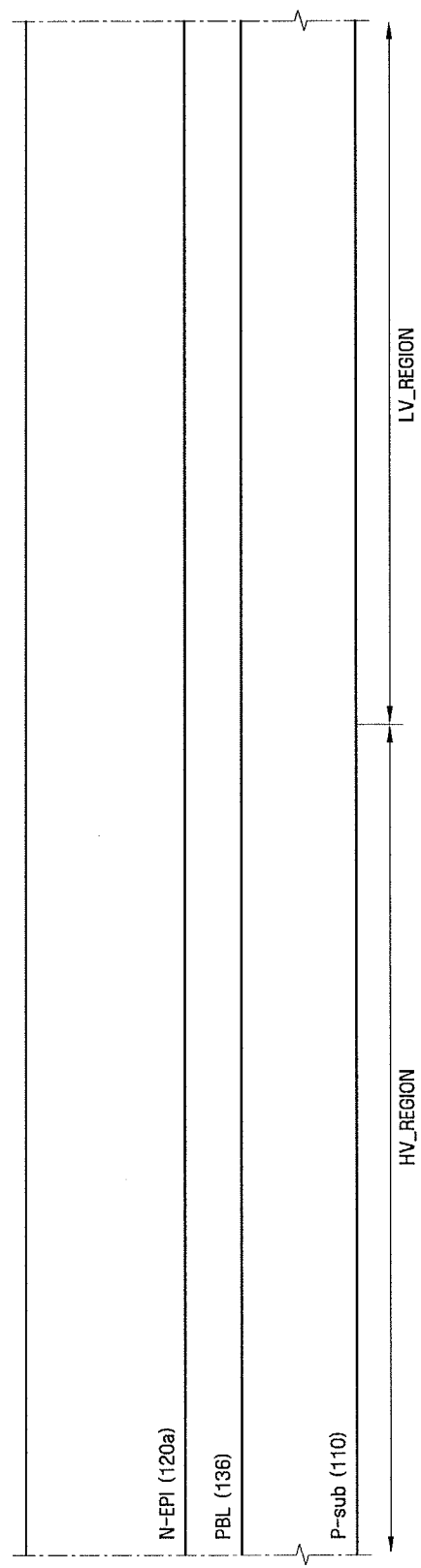

Referring to FIGS. 1 and 5, a second conductivity type, e.g., N-type, epitaxial layer 120a having a third impurity concentration (as indicated by reference symbol "N-EPI" in FIG. 1) may be formed on the substrate 110 having the buried impurity layer 136 (S120). In an implementation, the third impurity concentration may be smaller than the second impurity concentration of the buried impurity layer 136. The epitaxial layer 120a may be formed to a thickness such that Double Re-SURF (Double Reduced SURFace electric-field) performance of a the semiconductor integrated circuit device according to an embodiment may be sufficiently demonstrated.

Figure 6:
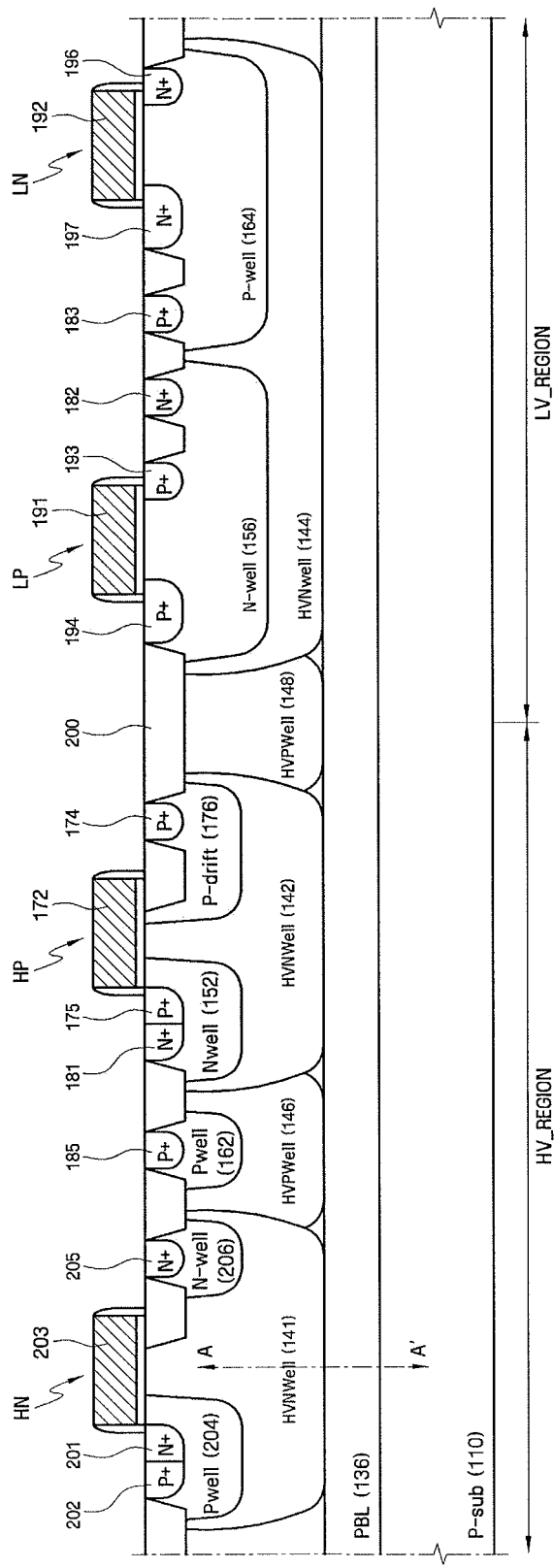

Referring to FIGS. 1 and 6, semiconductor devices (e.g., a first high-voltage transistor HP, a second high-voltage transistor HP, a first low-voltage transistor LP, a second low-voltage transistor LN, etc.) may be formed in or on the epitaxial layer 120a (S130). In the following description, a semiconductor device formed in or on the epitaxial layer 120a may be described with reference to FIG. 6 by way of example, but the embodiments are not limited thereto. Other types of semiconductor devices may also be formed in or on the epitaxial layer 120a. For example, although the semiconductor device shown in FIG. 6 may be fabricated by a shallow trench isolation (STI) process, a semiconductor device fabricated by a local oxidation (LOCOS) process may also be formed in or on the epitaxial layer 120a.

Referring to FIG. 6, a first deep well 141 and a second deep well 142 of the second conductivity type, e.g., N-type, may be formed in the high-voltage device region HV_REGION. The first deep well 141 and the second deep well 142 may contact the buried impurity layer 136, but the embodiments are not limited thereto.

A second conductivity type, e.g., N-type, third deep well 144 may be formed in the low-voltage device region LV_REGION. The third deep well 144 may also contact the buried impurity layer 136, but the embodiments are not limited thereto. In an implementation, the third deep well 144 may electrically isolate the buried impurity layer 136, a second conductivity type, e.g., N-type, first low-voltage well 156 including a first low-voltage transistor LP formed therein, and a first conductivity type, e.g., P-type, second low-voltage well 164 including a second low-voltage transistor LN formed therein, from one another.

A first conductivity type, e.g., P-type, first device isolation well 146 may be formed between the first high-voltage transistor HN and the second high-voltage transistor HP in the high-voltage device region HV_REGION. The first device isolation well 146 may contact the buried impurity layer 136, but the embodiments are not limited thereto. The first device isolation well 146 may serve as a device isolation area that electrically isolates the first high-voltage transistor HN and the second high-voltage transistor HP in the high-voltage device region HV_REGION from each other.

A first conductivity type, e.g., P-type, second device isolation well 148 may be formed between the high-voltage device region HV_REGION and the low-voltage device region LV_REGION. The second device isolation well 148 may contact the buried impurity layer 136, but the embodiments are not limited thereto. The second device isolation well 148 may serve as a device isolation area that electrically isolates the high-voltage device region HV_REGION and the low-voltage device region LV_REGION from each other.

A first conductivity type, e.g., P-type, first high-voltage well 204 and a second conductivity type, e.g., N-type, second high-voltage well 206 may be formed in the first deep well 141 in the high-voltage device region HV_REGION. A second conductivity type, e.g., N-type, third high-voltage well 152 and a first conductivity type, e.g., P-type, drift region 176 may be formed in the second deep well 142 in the high-voltage device region HV_REGION.

The second conductivity type, e.g., N-type, first low-voltage well 156 and the first conductivity type, e.g., P-type, second low-voltage well 164 may be formed in the third deep well 144 in the low-voltage device region LV_REGION.

A first conductivity type, e.g., P-type, fourth high-voltage well 162 may be formed in the first device isolation well 146 between the first high-voltage transistor HN and the second high-voltage transistor HP in the high-voltage device region HV_REGION.

In addition, as shown in FIG. 6, a plurality of trenches 200 that separate regions of the respective wells from one another may be formed on the substrate 110. Further, a field oxide layer (not shown) that defines regions for a first high-voltage transistor HN, a second high-voltage transistor HP, a first low-voltage transistor LP, and a second low-voltage transistor LN may also be formed on the substrate 110. As shown, a gate insulation layer and spacers may also be formed on the substrate 110.

As described above, the first high-voltage transistor HN may be a high-voltage NLDMOS transistor driven at, e.g., about 30 to about 50 V, and may include a gate electrode 203, a drain 205, and a source 201. In addition, as described above, the second high-voltage transistor HP may also be a high-voltage HLDMOS transistor driven at, e.g., about 30 to about 50 V, and may include a gate electrode 172, a drain 174, and a source 175.

The drains 205 and 174 may be formed in the second high-voltage well 206 and the drift region 176, respectively, and may have impurity concentrations higher than the second high-voltage well 206 and the drift region 176. In an implementation, the drift region 176 may help ensure that a breakdown voltage (BV) for a high voltage is achieved. The sources 201 and 175 may be formed in the first high-voltage well 201 and the third high-voltage well 152, respectively.

First and second ohmic contacts 202 and 181 may be portions to which driving voltages are applied. The first and second ohmic contacts 202 and 181 may be respectively formed in the first and third high-voltage wells 204 and 152 in contact with the sources 201 and 175 of the first and second high-voltage transistors HN and HP.

The first conductivity type, e.g., P-type, first low-voltage transistor LP may be a low-voltage transistor driven at, e.g., about 1 to about 5 V, and may include a gate electrode 191, a source 193, and a drain 194. The source 193 and the drain 194 may be formed in the first low-voltage well 156.

In addition, a third ohmic contact 182 may be a portion to which a power voltage is applied. The third ohmic contact 182 may be formed in the first low-voltage well 156, like the source 193 and the drain 194 of the first low-voltage transistor LP. In an implementation, the power voltage may be, e.g., about 1 to about 5 V.

The second conductivity type second low-voltage transistor LN may include a gate electrode 192, a drain 196, and a source 197. The drain 196 and the source 197 may be formed in the second low-voltage well 164.

A fourth ohmic contact 183 may be coupled to a ground voltage and may be formed in the second low-voltage well 164 (like the drain 196 and the source 197 of the second low-voltage transistor LN). A fifth ohmic contact 185 may be coupled to a ground voltage and may be formed in a fourth high-voltage well 162.

As described above, although not illustrated, an intermediate voltage device region may be further defined in the substrate 110. Accordingly, an intermediate voltage transistor (not shown) driven at, e.g., about 1 to about 5 V, may be further formed in the intermediate voltage device region (not shown).

The gate electrodes 203 and 172 and the buried impurity layer 136 may reduce a surface electric-field. Having both the gate electrodes 203 and 172 and the buried impurity layer 136 reduce the surface electric-field may be referred to as a Double Re-SURF throughout the specification. During operation, the epitaxial layer (120a of FIG. 5) may be fully depleted; and the electric fields between the source 201, 175 and the drain 205, 174 may reach substantially the same level, thereby allowing the high-voltage transistors HN and HP to achieve a high breakdown voltage (BV). Hence, the semiconductor integrated circuit device according to an embodiment may have stable device characteristics.

Next, a fabricating method of a semiconductor integrated circuit device according to another embodiment will be described with reference to FIGS. 7 and 8. In the following description, repeated descriptions of the same or corresponding parts as those of the previous embodiment will be omitted and only differences therebetween will be described herein.

Figure 7:
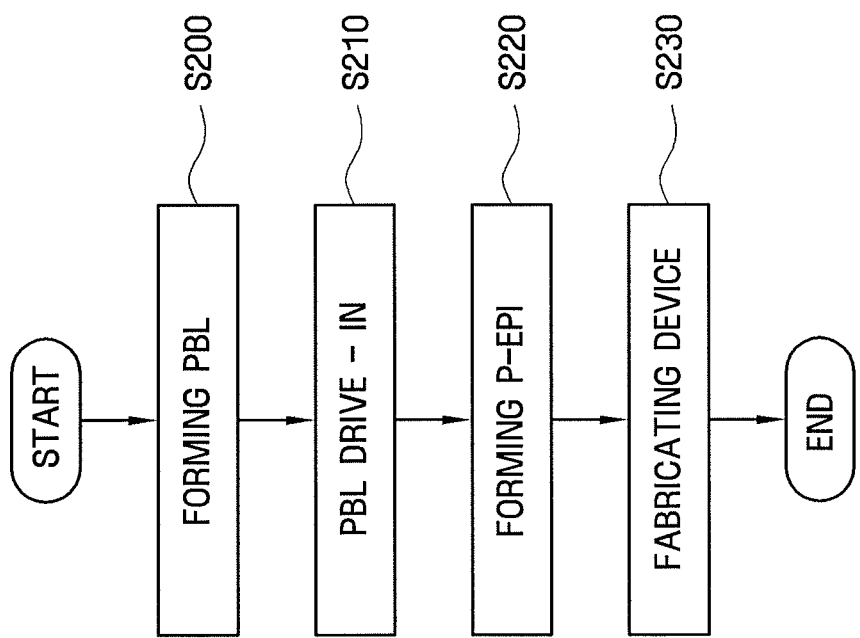
FIG. 7 illustrates a flowchart of a method of fabricating a semiconductor integrated circuit device according to another embodiment.

FIG. 7 illustrates a flowchart of a method of fabricating a semiconductor integrated circuit device according to another embodiment. FIG. 8 illustrates a cross-sectional view of a stage in the method of fabricating a semiconductor integrated circuit device of FIG. 7.

Referring first to FIG. 7, a first conductivity type substrate having a first impurity concentration may be prepared. Then, a buried impurity layer 136 including a first conductivity type impurity having a second impurity concentration (higher than the first impurity concentration) may be formed using blank implant (S200). Then, the buried impurity layer 136 formed on the substrate 110 may be subjected to a "drive-in" diffusion process (S210).

Referring now to FIGS. 7 and 8, a first conductivity type, e.g., P-type, epitaxial layer 120b having a third impurity concentration may be formed on the substrate 110 having the buried impurity layer 136 (S220). In an implementation, the third impurity concentration may be smaller than the impurity second concentration of the buried impurity layer 136. The epitaxial layer 120b may be formed to a thickness such that Double Re-SURF (Double Reduced SURFace electric-field) performance of the semiconductor integrated circuit device according to an embodiment may be sufficiently demonstrated.

Next, referring to FIG. 7 together with FIG. 6, semiconductor devices (e.g., a first high-voltage transistor HP, a second high-voltage transistor HP, a first low-voltage transistor LP, a second low-voltage transistor LN, etc.) may be formed in or on the epitaxial layer 120b (S230). For example, the fabricating method of a semiconductor integrated circuit device according to the present embodiment may be substantially the same as the fabricating method according to the previous embodiment, except that the first conductivity type, e.g., P-type, epitaxial layer 120b may be formed on the buried impurity layer 136.

Next, characteristics of the semiconductor integrated circuit device fabricated by the fabricating method according to an embodiment will be described with reference to FIGS. 9 and 10.

FIGS. 9 and 10 illustrate characteristics of the semiconductor integrated circuit device fabricated by the method according to an embodiment. In particular, FIG. 9 illustrates a graph showing impurity concentrations along the line A-A' of FIG. 6 and FIG. 10 illustrates a graph showing voltage-current characteristics depending impurity concentrations.

Referring first to FIG. 9, like the semiconductor integrated circuit devices fabricated by the method according to an embodiment, when a buried impurity layer 136 is formed by blank implant and subjected to a "drive-in" diffusion process (see the plot Q), it may be seen that the impurity concentration of the buried impurity layer 136 may be higher than that of the substrate 110.

In an comparative example, unlike the semiconductor integrated circuit devices fabricated by the fabricating method according to an embodiment, a buried impurity layer may not be formed by blank implant (see the plots P-1, P-2, and P-3). For example, diffusion between the substrate 110 and the buried impurity layer 136 may form impurity concentration distributions. Thus, a difference in the impurity concentration between the substrate 110 and the buried impurity layer 136 may not be so great. Furthermore, it may be quite difficult to accurately control the impurity concentration distribution in cases represented by the plots P-1 to P-3 during fabricating semiconductor integrated circuit devices. In addition, if there are changes in the thicknesses of the epitaxial layers (120a of FIGS. 5 and 120b of FIG. 8), it may be more difficult to accurately control the impurity concentration distribution; and the Double Re-SURF performance of the semiconductor integrated circuit device may further degrade and breakdown voltages (BVs) of the semiconductor integrated circuit device may be reduced.

Changes in the BVs depending on the change in the impurity concentration distribution are shown in FIG. 10. As represented by the plots P-1 and P-2 (the plot P-3 representing an ideal state resulting from diffusion), in the cases where accurately controlling the impurity concentration distribution between the substrate 110 and the buried impurity layer 136 is quite difficult (e.g., when it is not possible to know to which of the cases represented by the plots P-1, P-2, P-3 a state of the semiconductor integrated circuit device manufactured is applied), it is understood that the BV of the semiconductor integrated circuit device may be reduced.

In the semiconductor integrated circuit devices according to an embodiment (see the plot Q), the impurity concentrations of the buried impurity layer 136 and the substrate 110 may be accurately controlled using an implantation process, without using a diffusion process. Hence, stable Double Re-SURF performance of the semiconductor integrated circuit device may be realized. Therefore, current characteristics of the semiconductor integrated circuit device may be achieved in a stable manner.

Accordingly, the embodiments provide a method of fabricating a semiconductor integrated circuit device having an improved current characteristic of a semiconductor device.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A method of fabricating a semiconductor integrated circuit device, the method comprising: preparing a first conductivity type substrate including a first conductivity type impurity such that the first conductivity type substrate includes a high-voltage device region and a low-voltage device region, and such that the first conductivity type substrate has a first impurity concentration; forming a buried impurity layer using blank implant such that the buried impurity layer includes a first conductivity type impurity and has a second impurity concentration higher than the first impurity concentration forming an epitaxial layer on the substrate having the buried impurity layer thereon; forming a device isolation region in or on the epitaxial layer; and forming high-voltage semiconductor devices and a low-voltage semiconductor device in the high-voltage device region and the low-voltage device region, respectively, such that each of the high-voltage semiconductor devices includes a gate electrode, wherein the buried impurity layer is formed on the substrate by implanting the first conductivity type impurity at a dose of about $10^{14}$ atoms/cm$^2$ to about $10^{16}$ atoms/cm$^2$.

2. The method as claimed in claim 1, wherein:
the epitaxial layer includes a first conductivity type epitaxial layer having a third impurity concentration, and
the first conductivity type is a P-type.

3. The method as claimed in claim 2, wherein the second impurity concentration is higher than the third impurity concentration.

4. The method as claimed in claim 2, wherein the first conductivity type impurity includes boron.

5. The method as claimed in claim 1, wherein:
the epitaxial layer includes a second conductivity type epitaxial layer,
the first conductivity type is a P-type, and
the second conductivity type is an N-type.

6. The method as claimed in claim 1, further comprising performing a drive-in diffusion process on the buried impurity layer.

7. The method as claimed in claim 1, wherein:
the high-voltage semiconductor devices are driven at about 30 to about 50 V and the low-voltage semiconductor device is driven at about 1 to about 5 V, and
the device isolation region is formed between the high-voltage semiconductor devices and the low-voltage semiconductor device.

8. A method of fabricating a semiconductor integrated circuit device, the method comprising:
preparing a first conductivity type substrate such that the first conductivity type substrate includes a high-voltage device region and a low-voltage device region, and such that the first conductivity type substrate has a first impurity concentration;
implanting a first conductivity type impurity into an entire surface of the substrate at a first dose, such that the concentration of the first dose is greater than the first impurity concentration;
diffusing the first conductivity type impurity;
forming an epitaxial layer on the first conductivity type impurity diffused substrate; and
forming high-voltage semiconductor devices and a low-voltage semiconductor device in the high-voltage device region and the low-voltage device region, respectively, such that each of the high-voltage semiconductor devices includes a gate electrode,
wherein at least one of the group of the high-voltage semiconductor devices and the low-voltage semiconductor device includes a lateral double-diffused metal oxide semiconductor (DMOS) transistor.

9. The method as claimed in claim 8, wherein the first dose is about $10^{14}$ atoms/cm$^2$ to about $10^{16}$ atoms/cm$^2$.

10. The method as claimed in claim 8, wherein:
the high-voltage semiconductor devices include a high-voltage transistor driven at about 30 to about 50 V, and
the low-voltage semiconductor device includes a low-voltage transistor driven at about 1 to about 5 V.

11. The method as claimed in claim 8, wherein:
the epitaxial layer includes a first conductivity type epitaxial layer, and
the first conductivity type is a P-type.

12. The method as claimed in claim 11, wherein the first conductivity type impurity includes boron.

13. The method as claimed in claim 8, wherein:
the epitaxial layer includes a second conductivity type epitaxial layer,
the first conductivity type is a P-type, and
the second conductivity type is an N-type.

14. A semiconductor integrated circuit device, comprising:
a first conductivity type substrate having a first impurity concentration, the substrate having a high-voltage device region and a low-voltage device region defined therein;
a buried impurity layer on an entire surface of the substrate, the buried impurity layer:
including a first conductivity type impurity and having a second impurity concentration higher than the first impurity concentration, and being formed using blank implant;
an epitaxial layer on the buried impurity layer; and
high-voltage semiconductor devices and low-voltage semiconductor devices respectively formed in the high-voltage device region and the low-voltage device region formed in or on the epitaxial layer, wherein each of the high-voltage semiconductor devices includes a gate electrode, and the second impurity concentration is about $10^{14}$ atoms/cm$^2$ to about $10^{16}$ atoms/cm$^2$.

15. The semiconductor integrated circuit device as claimed in claim 14, wherein:
the epitaxial layer includes a first conductivity type epitaxial layer having a third impurity concentration,
the first conductivity type is a P-type, and
the first conductivity type impurity includes boron.

16. The semiconductor integrated circuit device as claimed in claim 15, wherein the second impurity concentration is higher than the third impurity concentration.

17. The semiconductor integrated circuit device as claimed in claim 14, wherein:
the epitaxial layer includes a second conductivity type epitaxial layer,
the first conductivity type is a P-type, and
the second conductivity type is an N-type.

18. The semiconductor integrated circuit device as claimed in claim 14, wherein:
the high-voltage semiconductor devices include a high-voltage lateral double-diffused metal oxide semiconductor (DMOS) transistor driven at about 30 to about 50 V, and
the low-voltage semiconductor devices include a low-voltage lateral double-diffused metal oxide semiconductor (DMOS) transistor driven at about 1 to about 5 V.

* * * * *